(12) United States Patent
Kim

(10) Patent No.: US 12,342,490 B2
(45) Date of Patent: Jun. 24, 2025

(54) ELECTRIC POWER CONVERTER FOR VEHICLE MOTOR

(71) Applicants: Hyundai Motor Company, Seoul (KR); Kia Corporation, Seoul (KR)

(72) Inventor: Yun Ho Kim, Whasung-Si (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 244 days.

(21) Appl. No.: 18/218,813

(22) Filed: Jul. 6, 2023

(65) Prior Publication Data

US 2024/0107699 A1    Mar. 28, 2024

(30) Foreign Application Priority Data

Sep. 27, 2022   (KR) .................. 10-2022-0122701

(51) Int. Cl.
*H05K 7/14*     (2006.01)
*H05K 7/20*     (2006.01)

(52) U.S. Cl.
CPC ..... *H05K 7/14322* (2022.08); *H05K 7/14329* (2022.08); *H05K 7/20927* (2013.01)

(58) Field of Classification Search
None
See application file for complete search history.

(56) References Cited

U.S. PATENT DOCUMENTS

| | | | |
|---|---|---|---|
| 9,241,428 B1* | 1/2016 | Doo ................... | H05K 7/20927 |
| 10,581,361 B2 | 3/2020 | Chen et al. | |
| 2010/0025126 A1* | 2/2010 | Nakatsu ................ | H05K 7/02 |
| | | | 361/699 |
| 2021/0143748 A1* | 5/2021 | Ikegami ............. | H05K 7/14329 |

FOREIGN PATENT DOCUMENTS

| | | |
|---|---|---|
| JP | H11-103012 | 4/1999 |
| JP | 3734122 | 1/2006 |
| JP | 2007-006575 | 1/2007 |
| JP | 5862702 | 2/2016 |
| JP | 2016-048997 | 4/2016 |
| JP | 2017-220961 | 12/2017 |
| KR | 10-2005-0082494 | 8/2005 |
| WO | WO2017-187577 | 11/2017 |

* cited by examiner

*Primary Examiner* — Krystal Robinson
(74) *Attorney, Agent, or Firm* — Morgan, Lewis & Bockius LLP

(57) ABSTRACT

An electric power converter for a motor includes a body portion, a plurality of first power module portions disposed on one side of the body portion, a plurality of second power module portions disposed on an opposite side facing the one side of the body portion along a first direction, a plurality of first busbars extending from the first power module portions toward the second power module portions along the first direction and corresponding to each of the first power module portions, and a plurality of second busbars extending from the second power module portions along a direction, in which the plurality of first busbars extends, and corresponding to each of the second power module portions.

16 Claims, 9 Drawing Sheets

ELECTRIC POWER CONVERTER FOR VEHICLE MOTOR

CROSS-REFERENCE TO RELATED APPLICATION

The present application claims priority to Korean Patent Application No. 10-2022-0122701, filed Sep. 27, 2022, the entire contents of which is incorporated herein for all purposes by this reference.

BACKGROUND OF THE PRESENT DISCLOSURE

Field of the Present Disclosure

The present disclosure relates to an electric power converter for a motor, and more particularly, to an electric power converter for a motor in which two power modules are provided and connected to the motor.

Description of Related Art

To drive a polyphase motor of an electrified vehicle, an inverter including a plurality of switching elements is required.

In general, an inverter includes a plurality of switching elements including a pair of switching elements each corresponding to each of phases. For example, in the case of a three-phase motor, a pair of switching elements is applied to each phase, so that a total of six switching elements may be applied. Two switching elements corresponding to each phase are turned on/off to be complementary to each other when driving the motor, and all switching elements are controlled to be on/off by pulse width modulation to provide power, which is required for driving the motor, to the motor.

In general, one inverter circuit is often applied to drive a motor, but a method using two inverters, each of which is applied to each of opposite ends of a motor coil, is known to improve the output of the motor and improve driving efficiency.

When one inverter is applied, one end of each of the motor coils provides a short-circuited neutral point, so a method of driving a motor using one inverter is called a close end winding method. On the other hand, because the method using two inverters connects the inverters to opposite ends of each of the motor coils, respectively, one end of each of the motor coil is not shorted mutually, so the present method is called an open end winding method.

On the other hand, a method of driving a motor winding by selectively applying the close end winding and the open end winding by selectively shorting/opening one end of each of the motor coils is also known, in which an inverter to each of the opposite ends of each of the motor coils is applied as in the open end winding method and additional switching elements are provided to mutually short or open one end of each of the motor coils.

In the instant case, a number of switching elements are required, such as switching elements for implementing each inverter and switching elements for selecting an operation method, so it is necessary to implement a motor drive device by efficiently modularizing a number of switching elements in consideration of cooling performance and the like.

The information included in this Background of the present disclosure is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing an electric power converter for a motor in which power modules are provided to be symmetrical to each other on opposite sides of a body portion where a dc capacitor is provided, busbars connecting the motor and the power modules are provided to extend in a direction of the power module on one side, and each of the busbars is arranged in alternating order, whereby each of the busbars does not overlap the other and is set to a minimum length.

In various aspects of the present disclosure, there may be provided an electric power converter for a motor, the converter including: a body portion; a plurality of first power module portions disposed on one side of the body portion; a plurality of second power module portions disposed on an opposite side facing the one side of the body portion along a first direction thereof; a plurality of first busbars extending from the first power module portions toward the second power module portions along the first direction and corresponding to each of the first power module portions; and a plurality of second busbars extending from the second power module portions along a direction, in which the plurality of first busbars extends, and corresponding to each of the second power module portions, and characterized by that each of the first busbars and the second busbars is disposed in alternating order along a second direction intersecting the first direction thereof.

The plurality of first busbars may respectively correspond to NU, NV, and NW phases, and the plurality of second busbars may respectively correspond to U, V, and W phases.

Each of the first busbars and the second busbars may be arranged in an order of NU, U, NV, V, NW, and W along the second direction.

Each of the first busbars and the second busbars may be arranged in an order of U, NU, V, NV, W, and NW along the second direction.

Each of the first busbars and the second busbars may be arranged in an order of NV, V, NW, W, NU, and U along the second direction.

The electric power converter may further include a current sensor coupled to an external side of the second power module portions and configured to measure a current of the first power module portions and the second power module portions by having the first busbars and the second busbars connected thereto.

The current sensor may include AC output terminals connected to the motor, wherein the AC output terminals may be connected to the first busbars and the second busbars arranged in alternating order to each other thereon.

The plurality of first busbars may form a busbar module integrally coupled to the body portion.

The electric power converter may further include a DC capacitor accommodated in the body portion.

The second power module portion may be connected to the motor and be operated all the time, and the first power module portion may be temporarily operated to increase an output of the motor.

The electric power converter may further include a changeover switch module coupled to an external side of the first power module portions and connected to a controller to operate the first power module portions when disconnected.

As described above, according to an exemplary embodiment of the present disclosure, provided are a first power module portion disposed on one side of the body portion, a second power module portion disposed on an opposite side facing one side of the body portion along the first direction, the second power module portion in the first direction, a plurality of first busbars extending from the first power module portions toward the second power module portions along a first direction, and a plurality of second busbars extending from the second power module portion extending along a direction in which the plurality of first busbars extends. As a result, the first busbars can extend in a straight line and extend without intersecting the second busbars, and the first busbars and the second busbars are arranged in alternating order to reduce the length of the first busbar, achieving an effect of minimizing the volume and weight of the first busbars. Accordingly, there is an effect of reducing the cost, and also there is an effect that the layout problem does not occur because the busbars do not overlap each other.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
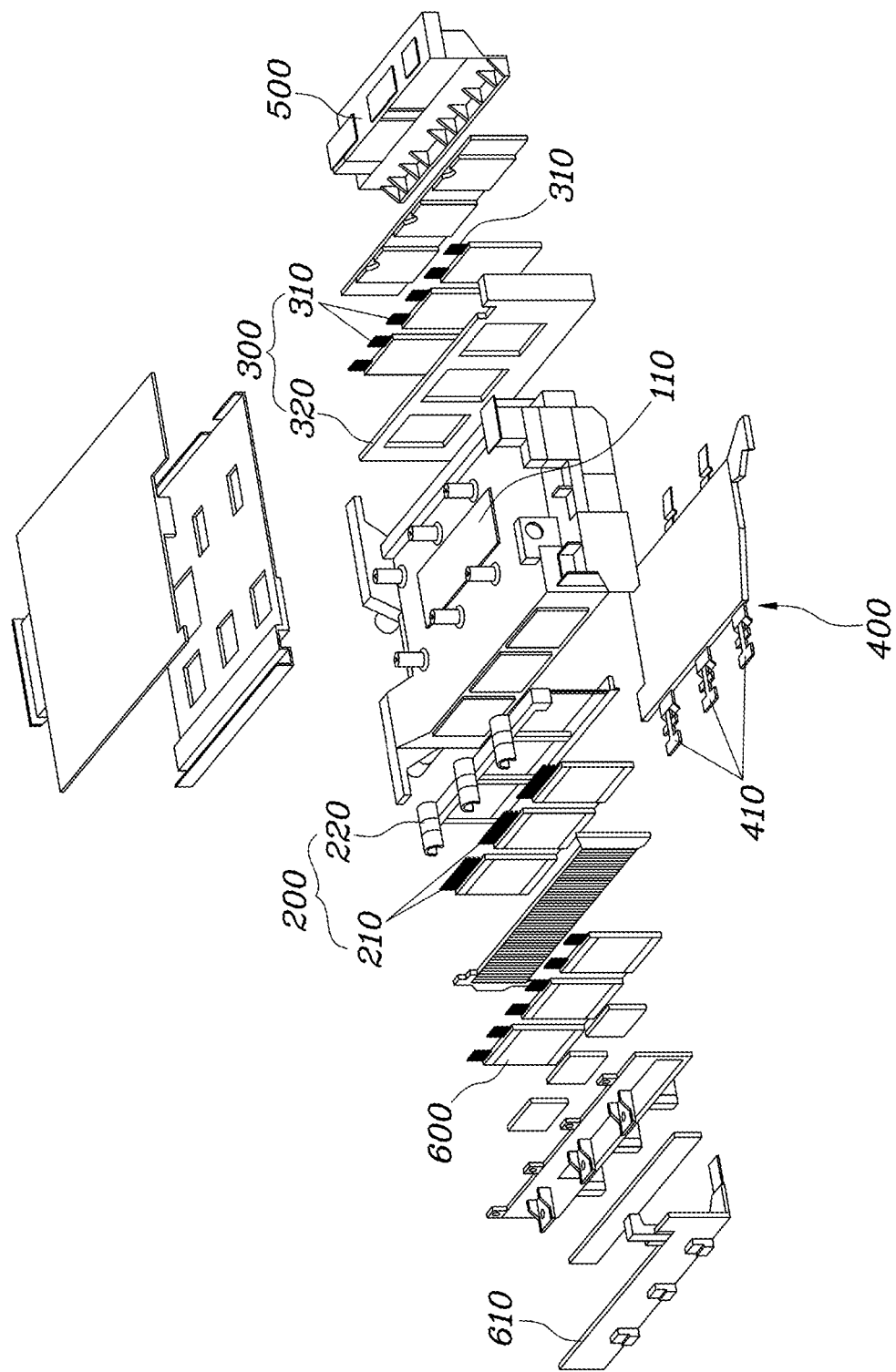
FIG. 1 is a perspective view of an electric power converter for a vehicle motor according to an exemplary embodiment of the present disclosure.

It may be understood that the appended drawings are not necessarily to scale, presenting a somewhat simplified representation of various features illustrative of the basic principles of the present disclosure. The specific design features of the present disclosure as included herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Hereinafter, the exemplary embodiments included in the present specification will be described in detail with reference to the accompanying drawings, but the same or similar components are assigned the same reference numerals regardless of reference numerals, and overlapping descriptions thereof will be omitted.

Suffixes "module" and "part" for the components used in the following description are provided or mixed in consideration of only the ease of writing the specification and do not have distinct meanings or roles by themselves.

In describing the exemplary embodiments included in the present specification, when it is determined that detailed descriptions of related known technologies may obfuscate the gist of the exemplary embodiments included in the present specification, the detailed description thereof will be omitted. Furthermore, the accompanying drawings are only to aid in easy understanding of the exemplary embodiments included in the present specification, and the technical idea included herein is not limited by the accompanying drawings, and all changes included in the spirit and scope of the present disclosure should be understood to include equivalents or substitutes.

Terms including ordinal numbers such as first, second, and the like may be used to describe various elements, but the elements are not limited by the terms. The above terms are used only for distinguishing one component from another.

When a component is referred to as being "connected" or "coupled" to another component, it may be directly connected or coupled to another component, but it should be understood that other components may exist in between. On the other hand, when a component is referred to as being "directly connected" or "directly connected" to another component, it should be understood that there are no other components in between.

A singular expression includes a plural expression unless the context clearly dictates otherwise.

In the present specification, terms such as "comprises" or "have" are intended to designate that the features, numbers, steps, operations, components, parts, or combinations thereof described in the specification exist and should be understood that it does not preclude the possibility of addition or existence of one or more other features, numbers, steps, operations, components, parts, or combinations thereof.

Furthermore, a unit or a control unit included in the names of a motor control unit (MCU), a hybrid control unit (HCU), and the like is only a term widely used in the naming of a control unit which is configured to control a specific vehicle function but does not mean a generic function unit.

A controller may include a communication device that communicates with other controllers or sensors to control a function in charge, a memory that stores a command of an operating system or logic, input/output information, and the like, and at least one processor that is configured to perform judgment, operation, decision, and the like necessary for controlling the function in charge.

A general inverter by a close end winding method for driving a motor requires only three output terminals, so that the configuration of the busbars and the output terminals is simple.

However, to implement a method of driving the motor by selectively applying the close end winding and the open end winding (hereinafter referred to as a "two-stage method" for convenience), an AC terminal of the power module needs to be connected to each of opposite ends of each of the three windings provided in the motor, so six output terminals are required for the inverter. When two switching elements corresponding to a top phase and a bottom phase are implemented as one power module in the inverter, and the inverter is configured so that one power module corresponds to one phase, a total of six power modules are used. In the instant case, the AC output terminal corresponds to a node to which two switching elements are connected in series with each other. Accordingly, when the power module corresponding to each phase and each AC output terminal are arbitrarily disposed, the path of the busbar connected to the output terminal may overlap or become undesirably long depending on the arrangement of the power modules and the output terminals. Copper is commonly applied to busbars, so cost and weight competitiveness may be reduced, and in some cases, the size of the AC output terminals may be increased, or easiness of assembling may be reduced depending on the configuration of the power modules and may also be disadvantageous in sealing the output terminal.

Accordingly, an exemplary embodiment of the present disclosure proposes to efficiently configure the busbars and the internal layout by optimizing the position arrangement of the power modules and the AC output terminals in the inverter supporting the two-stage method.

Figure 2:
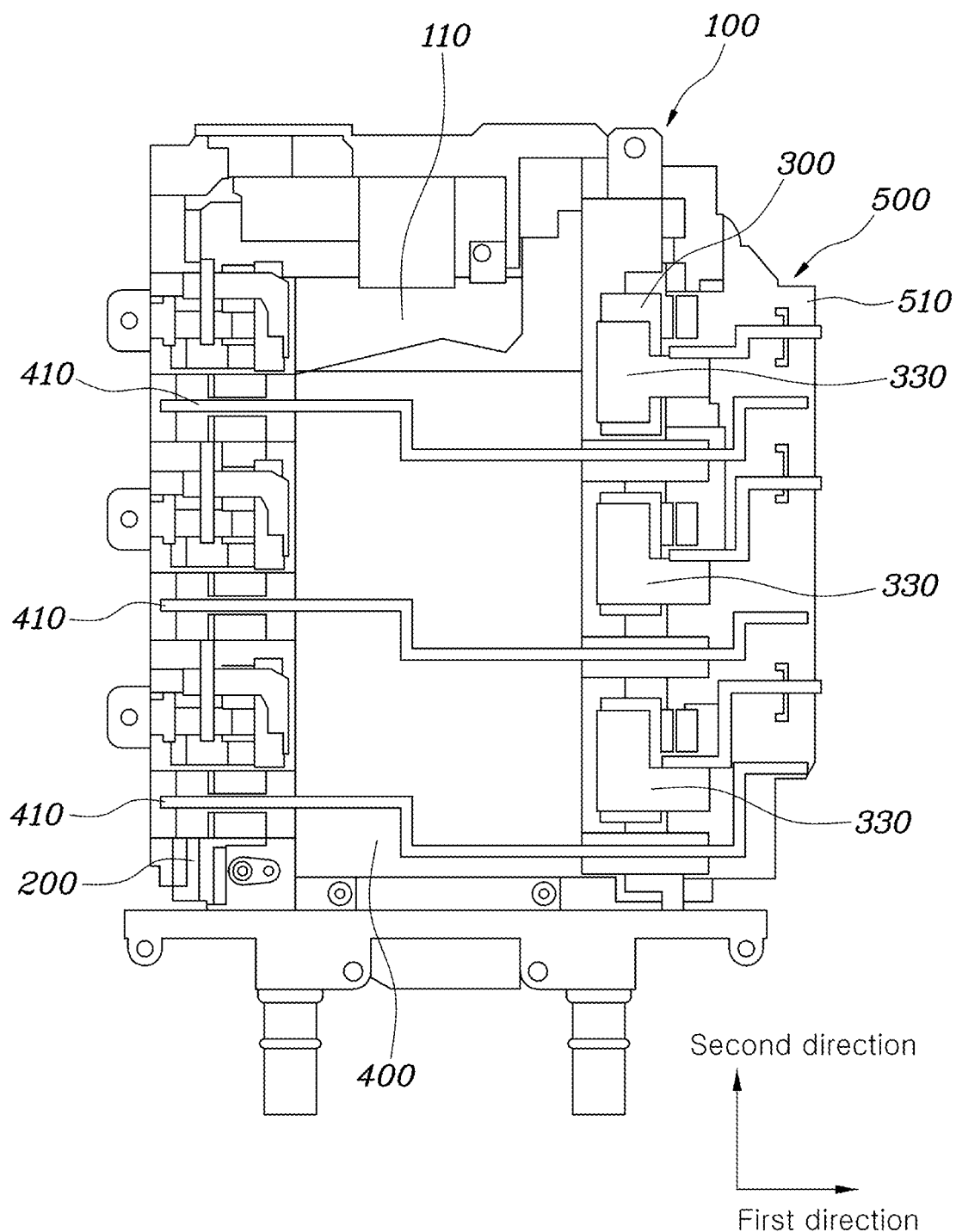
FIG. 2 is a bottom view of the electric power converter for a vehicle motor according to the exemplary embodiment of the present disclosure.
Figure 3:
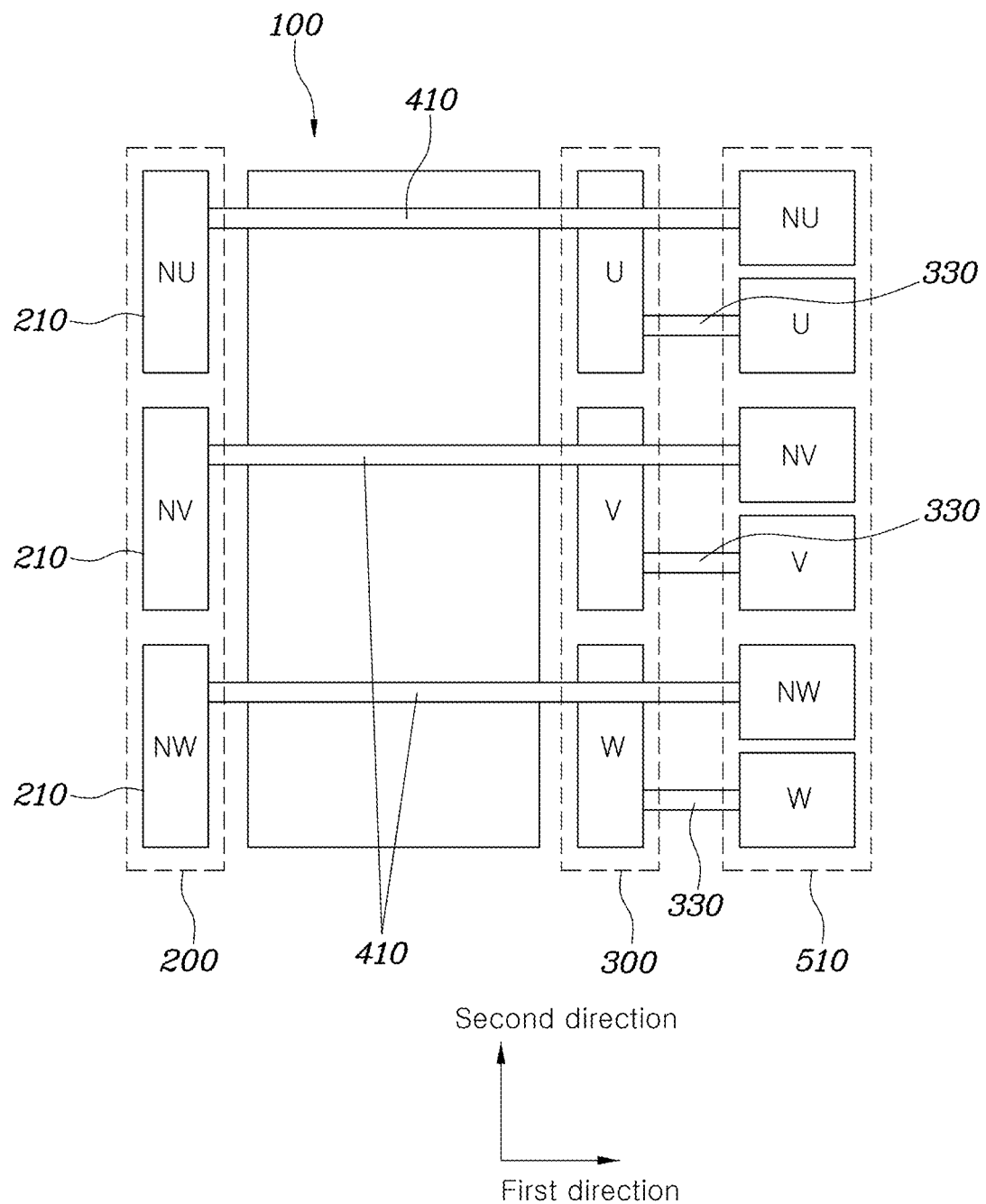
FIG. 3, FIG. 4, and FIG. 5 are views each illustrating an exemplary embodiment of the arrangement of the first busbar and the second busbar included in the electric power converter for a vehicle motor according to an exemplary embodiment of the present disclosure.
Figure 4:
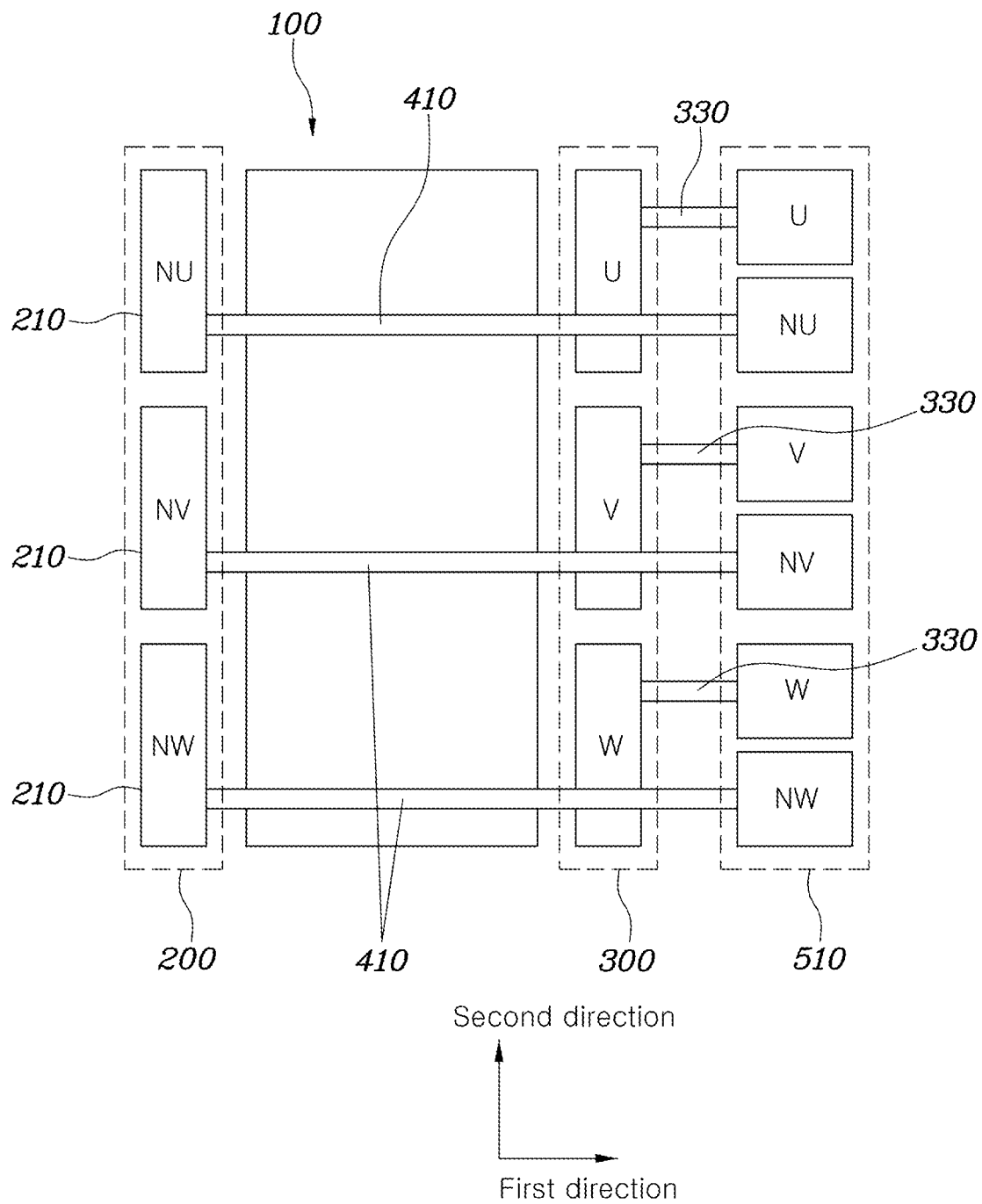
Figure 5:
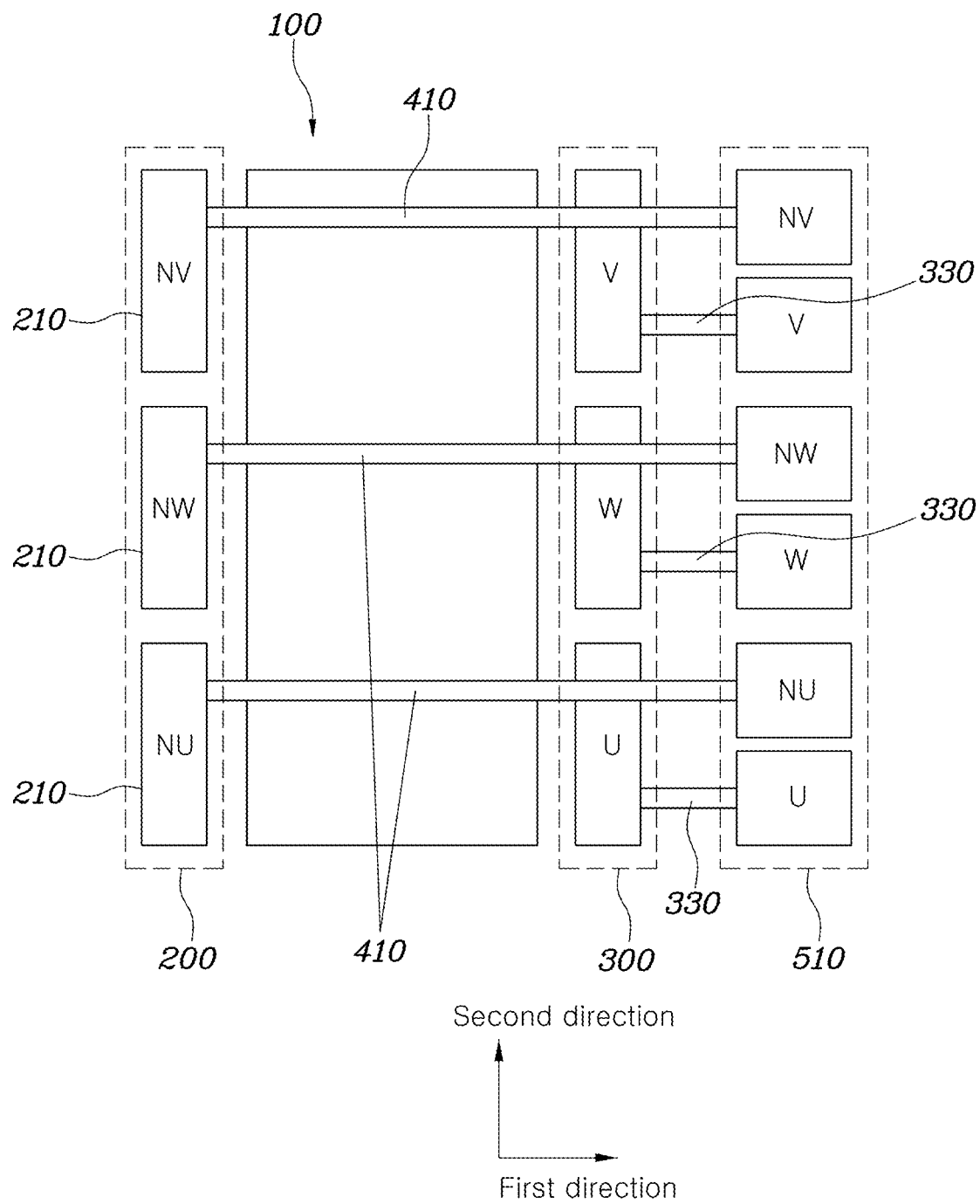
Figure 6A:
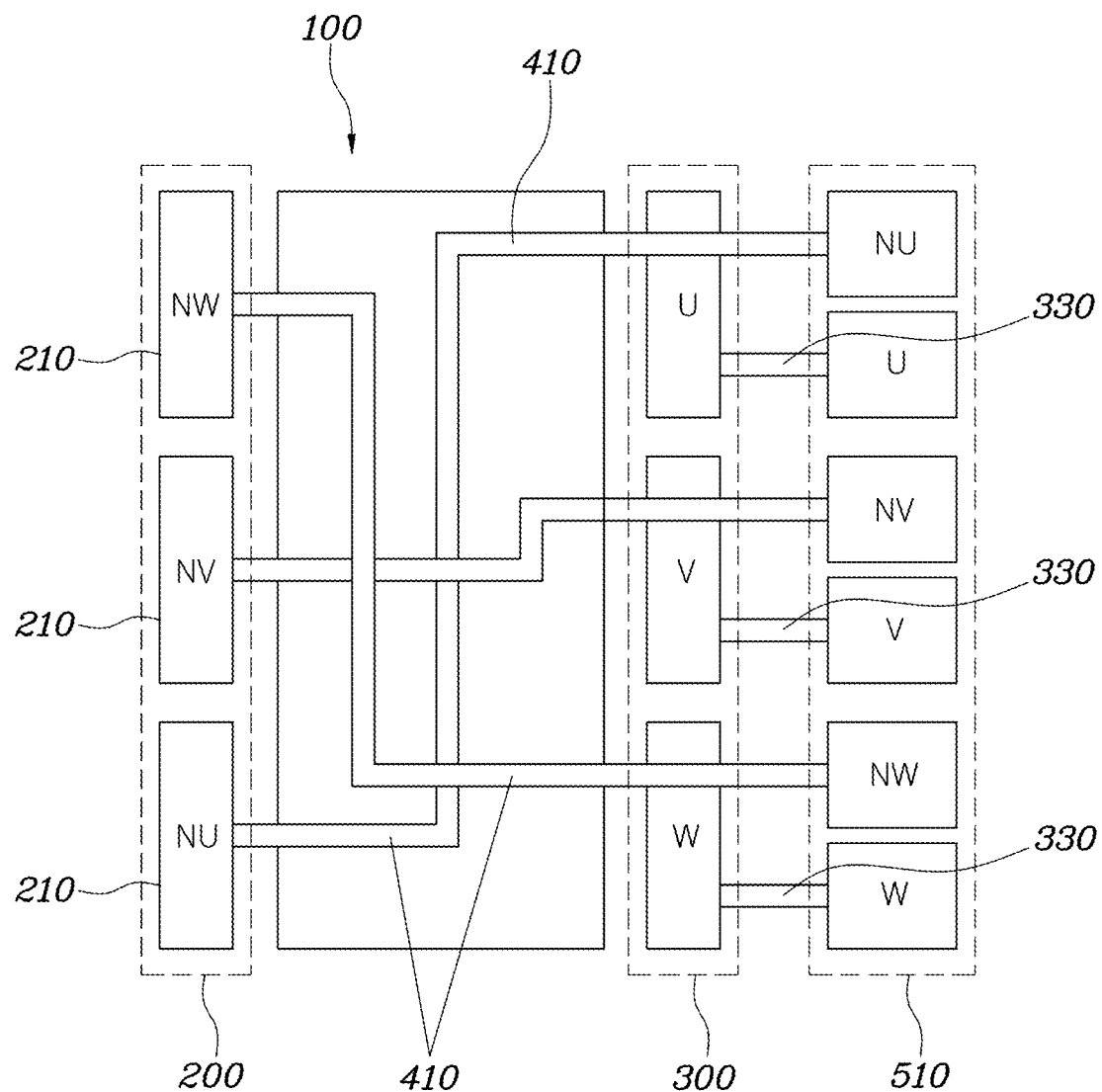
FIG. 6A, FIG. 6B, FIG. 6C, and FIG. 6D are diagrams each illustrating an arrangement of a first busbar and a second busbar of the electric power converter for a vehicle motor according to the related art.
Figure 6B:
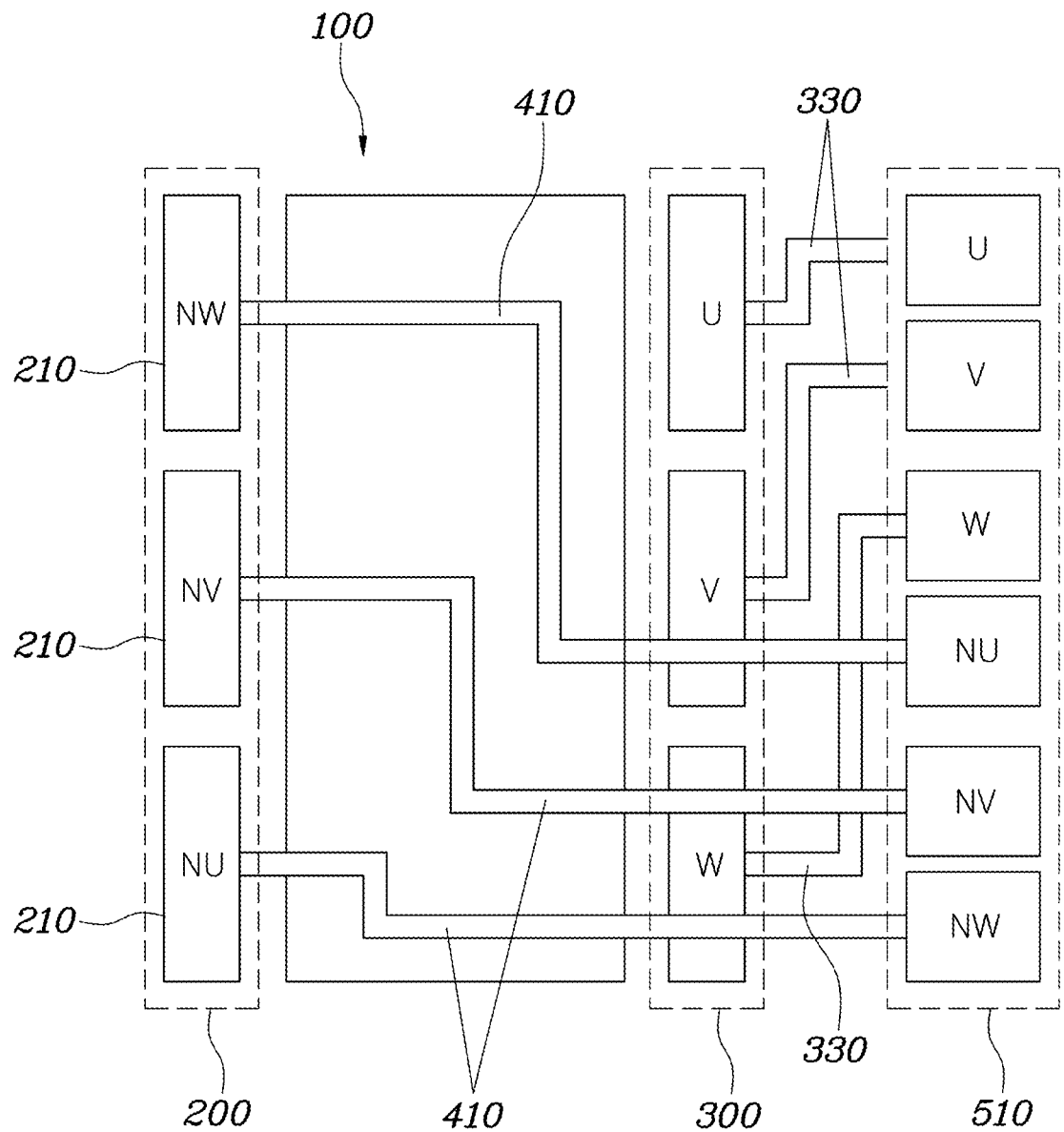
Figure 6C:
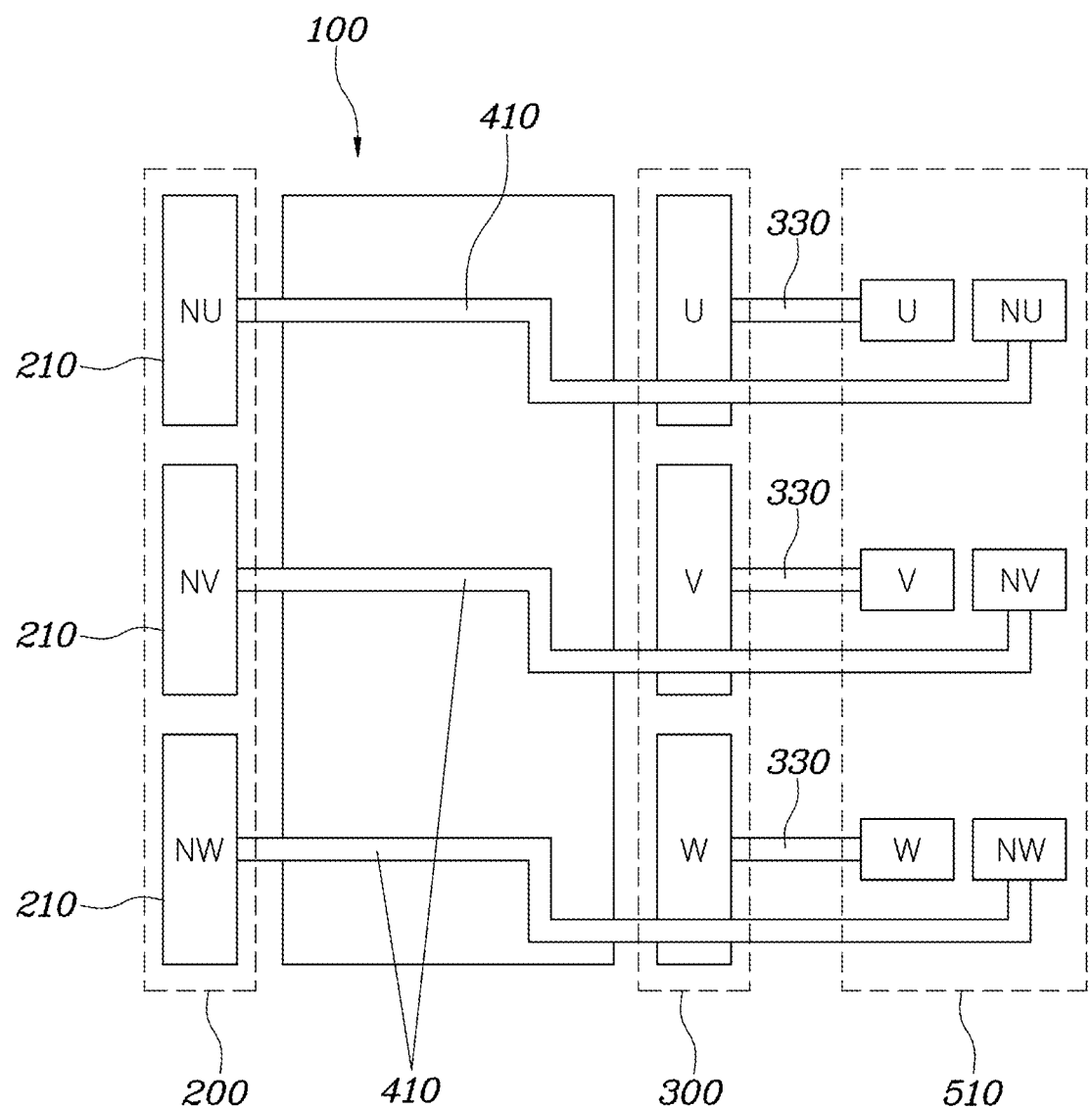
Figure 6D:
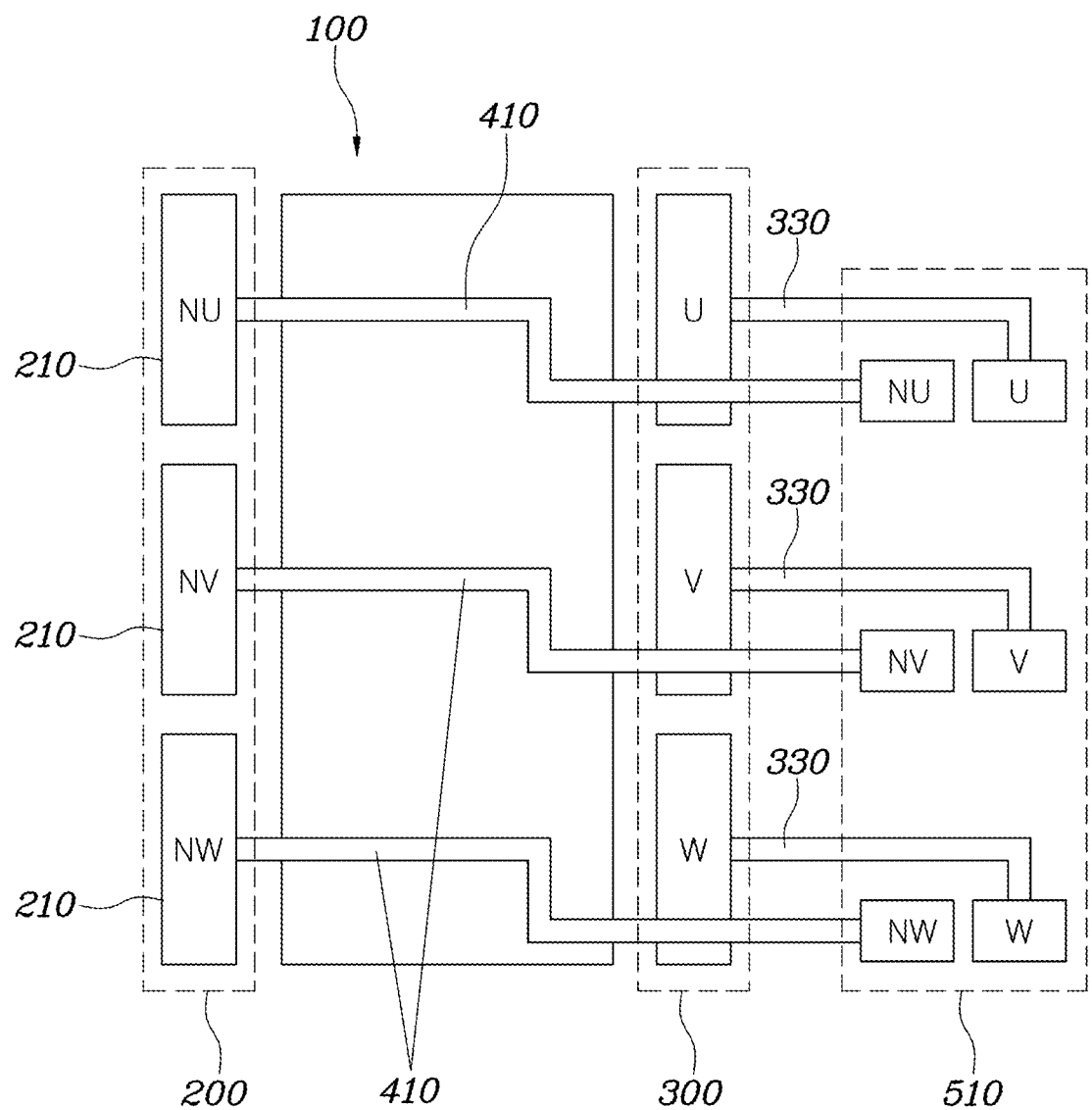

FIG. 1 is a perspective view of an electric power converter for a vehicle motor according to an exemplary embodiment of the present disclosure, FIG. 2 is a bottom view of the electric power converter for a vehicle motor according to the exemplary embodiment of the present disclosure, FIG. 3, FIG. 4, and FIG. 5 are views each illustrating an exemplary embodiment of the arrangement of the first busbar 410 and the second busbar 330 included in the electric power converter for a vehicle motor according to an exemplary embodiment of the present disclosure, and FIG. 6A, FIG. 6B, FIG. 6C, and FIG. 6D are diagrams each illustrating an arrangement of a first busbar 410 and a second busbar 330 of the electric power converter for a vehicle motor according to the related art.

With reference to FIGS. 1 to 6D, an exemplary embodiment of the electric power converter for a vehicle motor according to an exemplary embodiment of the present disclosure will be described.

Recently, as the development of electric vehicles driven by electric power continues, research on motors mounted on electric vehicles has been continued.

The motor may be operated with AC current, DC current flows through a high voltage battery mounted on the electric vehicle, and a power converter that converts the DC current of the high-voltage battery into AC current for use in the motor has been mounted on a vehicle.

The present disclosure relates to the above-described electric power converter.

As shown in FIG. 1, a body portion 100 to which a first power module portion 200, a second power module portion 300, a first busbar 410, and a second busbar 330 may be mounted may be provided. The first power module portion 200 may be coupled to one side of the body portion 100, and the second power module portion 300 may be disposed to face the first power module portion 200 to each other by being coupled to an opposite side of the body portion 100 in a first direction.

Furthermore, a plurality of first busbars 410 extending in the first direction may be disposed to correspond to the first power module portion 200 and connected to the first power module portion 200, a plurality of second busbars 330 is connected to correspond to the second power modules 310 and extends in the first direction, and a phase current may be supplied to the motor through the first busbars 410 and the second busbars 330.

A motor is provided with windings corresponding to each of phases, and the plurality of first busbars 410 and the plurality of second busbars 330 may be connected to the motor.

Assuming a three-phase motor, the plurality of first busbars 410 may respectively correspond to NU, NV, and NW phases, and the plurality of second busbars 330 may respectively correspond to U, V, and W phases. Here, U, V, and W phases have a phase difference of 120 degrees from sequentially adjacent phases, and NU, NV, and NW phases have a phase difference of 120 degrees from sequentially adjacent phases, respectively.

For example, in the case of a three-phase motor, a busbar corresponding to the NW phase of the first busbar 410 and a busbar corresponding to the W phase of the second busbar 330 are respectively connected to opposite ends of the winding corresponding to the first phase. As an exemplary embodiment of the present disclosure, a busbar corresponding to the NV phase of the first busbars 410 and a busbar corresponding to the V phase of the second busbars 330 may be respectively connected to opposite ends of the winding corresponding to the second phase. Furthermore, a busbar corresponding to the NU phase of the first busbars 410 and a busbar corresponding to the U phase of the second busbars 330 may be respectively connected to opposite ends of the winding corresponding to the third phase.

As a result, in a close end winding mode, a phase current is supplied to each winding corresponding to the first, second, and third phases of the 3-phase motor through different second busbars 330, and in an open end winding mode, a phase current may be supplied to opposite ends through any one of the U-NU, V-NV, and W-NW pair of winding of the 3-phase motor.

In the instant case, the plurality of first busbars 410 and the plurality of second busbars 330 may be alternately arranged in one direction, that is, arranged in alternating order as shown in FIG. 2.

As shown in FIG. 6A, FIG. 6B, FIG. 6C, and FIG. 6D, when the first busbars 410 and the second busbars 330 are not arranged in alternating order, a section in which the paths of the busbars overlap occurs, which is disadvantageous to the layout configuration of the electric power converter, and the busbars become undesirably long, so there is a problem that cost and weight competitiveness may be lowered.

In contrast, the plurality of first busbars 410 and the plurality of second busbars 330 are arranged in alternating order, not crossing each other, and the plurality of first busbars 410 and the plurality of second busbars 330 are arranged without overlapping each other between the paths and minimize the path from being bypassed, having an effect that the weight of the plurality of first busbars 410 and the plurality of second busbars 330 may be reduced and an effect of reducing the cost accordingly.

As shown in FIG. 2, the first busbars 410 and the second busbars 330 extend in the first direction, and the first busbars 410 respectively connected to NU, NV, and NW phases, and the second busbars 330 respectively connected to the U, V, and W phases may be disposed in alternating order.

At the present time, two busbars may be connected to each of the three phases of the three-phase motor, the NU phase may be connected to a phase the same as the U phase, the NV phase may be connected to a phase the same as the V phase, and the NW phase may be connected to a phase the same as the W phase.

As various exemplary embodiments of the present disclosure, each of the first busbars 410 and the plurality of second busbars 330 may be arranged in an order of NU, U, NV, V, NW, and W along the second direction.

As shown in FIG. 3, the first busbars 410 connected to the NU, NV, and NW phases and the second busbars 330 respectively connected to the U, V, and W phases may be connected to each other in alternating order, each pair of NU and U, NV and V, and NW and W phases connected to the same phase are disposed adjacent to each other, and each may be disposed in alternating order.

As various exemplary embodiments of the present disclosure, each of the first busbars 410 and the plurality of second busbars 330 may be arranged in an order of U, NU, V, NV, W, and NW along the second direction.

As shown in FIG. 4, the first busbars 410 respectively connected to the NU, NV, and NW phases, and the second busbars 330 respectively connected to the U, V, and W phases may be connected to each other in alternating order, each pair of NU and U, NV and V, and NW and W phases respectively connected to the same phase may be disposed adjacent to each other. In the various exemplary embodiments of the present disclosure, the U, V, and W phases and NU, NV, and NW phases may be connected in alternating order, and even when they are connected in the present way, the first busbars 410 and the second busbars 330 do not cross each other.

As various exemplary embodiments of the present disclosure, each of the first busbars 410 and the plurality of second busbars 330 may be arranged in an order of NV, V, NW, W, NU, and U along the second direction.

As shown in FIG. 5, the first busbars 410 respectively connected to the NU, NV, and NW phases, and the second busbars 330 respectively connected to the U, V, and W phases may be connected to each other in alternating order, each pair of NU and U, NV and V, and NW and W phases respectively connected to the same phase are disposed adjacent to each other, and each may be disposed in alternating order. In the various exemplary embodiments of the present disclosure, the NV, NW, and NU phases and the V, W, and U phases may be connected in alternating order, and even when they are connected in the present way, the first busbars 410 and the second busbars 330 do not cross each other.

Through this scheme, in the various exemplary embodiments of the present disclosure, the first busbars 410 extend in a straight line and extend so as not to intersect the second busbars 330, having an effect of reducing the cost by reducing the length and weight of the first busbars 410 and having an effect of not occurring the problem of layout because the busbars do not overlap each other.

The electric power converter may further include a current sensor 500 coupled to an external side of the second power module portion 300 and configured to measure the current of the first power module portion 200 and the second power module portion 300 by having the first busbars 410 and the second busbars 330 connected thereto.

The first busbars 410 and the second busbars 330 arranged in alternating order may be connected to the current sensor 500 connected to an external side of the second power module 310, respectively.

The current sensor 500 includes an AC output terminal 510 connected to the motor, and the AC output terminal 510 may be provided with a plurality of phases of the first busbars 410 and a plurality of phases of the second busbars 330 arranged in alternating order to each other thereon, whereby the first busbars 410 and the second busbars 330 may be connected thereto.

As shown in FIG. 2, FIG. 3, FIG. 4 and FIG. 5, the current sensor 500 may be connected to the motor, and the AC output terminal 510 connected to the motor may be provided with a plurality of phases arranged in alternating order thereon in a direction to correspond to the phases of the first busbars 410 and the second busbars 330 arranged in alternating order.

Through this, the first busbars 410 and the second busbars 330 are connected to the current sensor 500, and by minimizing the length of the AC output terminal 510 connected from the current sensor 500 to the motor, the manufacturing cost of the current sensor 500 is minimized, achieving an effect of reducing the overall cost.

The plurality of first busbars 410 may be integrally coupled to each other to form a busbar module 400 coupled to the body portion 100.

As shown in FIG. 1 and FIG. 2, the plurality of first busbars 410 provides an integrally coupled busbar module 400, and the busbar module 400 is configured so that an operator may couple the first busbars 410 extending in the first direction to the body portion 100 at the same time.

Accordingly, efficiency of the operation may be increased, and through this, there is an effect of reducing the manufacturing cost of the current conversion device for the vehicle motor.

The electric power converter may further include DC capacitor 110 accommodated in the body portion 100.

The DC capacitor 110 is connected to a high voltage battery provided in the vehicle so that the voltage of the high voltage battery is applied thereto and is respectively connected to the first power module 210 and the second power module 310 combined with the body portion, allowing DC current of the high voltage battery to be applied to the first power module 210 and the second power module 310.

Accordingly, the first power module 210 and the second power module 310 may convert the DC current input from the DC capacitor into AC current and operate the motor by applying AC current to the plurality of phases of the motor through the first busbars 410 and the second busbars 330.

The second power module portion 300 is connected to the motor and is operated all the time, and the first power module portion 200 may be temporarily operated to increase an output of the motor.

The second power module portion 300 connected to the motor is operated all the time, thereby operating the motor by inputting AC current to the motor when the driving mode of the vehicle is in a normal mode, and when the driver changes the driving mode of the vehicle to a driving mode that requires a higher motor output, such as a high output mode, the first power module portion 200 operates simultaneously with the second power module portion 300 and improves the output of the motor, and the driver may drive the vehicle in high power mode.

Through this, in a general driving mode of the vehicle, only the second power module portion 300 may be operated, and in the high output mode, the first power module portion 200 and the second power module portion 300 may be simultaneously operated to allow the vehicle to be operated at the high output desired by the driver.

The electric power converter may further include: a changeover switch module 600 coupled to an external side of the first power module portion 200 and connected to the controller to operate the first power module portion 200 when disconnected; and a third busbar 610 connecting the changeover switch module 600 and the first power module portion 200.

As shown in FIG. 1, the changeover switch module 600 coupled to the external side of the first power module portion 200 may be connected to the first power module portion 200 through the third busbar 610 and may control the operation of the first power module 210 temporarily operated through operation of the changeover switch module 600.

A cooling flow path through which cooling water flows to cool the DC capacitor 110, the first power module 210, and the second power module 310 may be provided in the body portion 100, and the cooling flow path may be branched to provide an extrusion cooling portion configured to cool the changeover switch module 600, wherein the extrusion cooling portion is disposed between the second power module portion and the changeover switch, and after flowing between the second power module portion and the changeover switch, the cooling water may be introduced again into the cooling path of the body portion 100.

The first power module portion 200 may include the plurality of first power modules 210 and a first bracket portion 220 fastened to the plurality of first power modules 210 and coupled to the body portion 100, and the second power module portion 300 may include the plurality of second power modules 310 and a second bracket portion 320 fastened to the plurality of second power modules 310 and coupled to the body portion 100.

As shown in FIG. 1, each of the first power module portion 200 and the second power module portion 300 may be provided with a plurality of power modules, the first power module portion 200 and the second power module portion 300 each including the plurality of power modules are coupled to the first bracket portion 220 and the second bracket portion 320 to be modularized, respectively, and the modularized first power module portion 200 and the second power module portion 300 may each be integrally coupled to the body portion 100.

Through this, the operator may easily couple the first power module portion 200 and the second power module portion 300 each including the plurality of power modules to the body portion 100, so efficiency of work may be increased, and through this, there is an effect which may reduce the manufacturing cost of the electric power converter for a vehicle motor.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may be configured to generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the scope of the present disclosure includes software or machine-executable commands (e.g., an operating system, an application, firmware, a program, etc.) for facilitating operations according to the methods of various embodiments to be executed on an apparatus or a computer, a non-transitory computer-readable medium including such software or commands stored thereon and executable on the apparatus or the computer.

In various exemplary embodiments of the present disclosure, the control device may be implemented in a form of hardware or software, or may be implemented in a combination of hardware and software.

Furthermore, the terms such as "unit", "module", etc. included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodi-

What is claimed is:

1. An electric power converter for a motor, the electric power converter comprising:
   a body portion;
   a plurality of first power module portions disposed on one side of the body portion;
   a plurality of second power module portions disposed on an opposite side facing the one side of the body portion along a first direction;
   a plurality of first busbars extending from the first power module portions toward the second power module portions along the first direction and corresponding to each of the first power module portions; and
   a plurality of second busbars extending from the second power module portions along a direction, in which the plurality of first busbars extends, and corresponding to each of the second power module portions,
   wherein each of the first busbars and the second busbars is disposed in alternating order along a second direction intersecting the first direction.

2. The electric power converter of claim 1, wherein the first busbars and the second busbars extend in the first direction so as not to cross to each other.

3. The electric power converter of claim 1,
   wherein the plurality of first busbars respectively corresponds to NU, NV, and NW phases, and
   wherein the plurality of second busbars respectively corresponds to U, V, and W phases.

4. The electric power converter of claim 3, wherein the first busbars and the second busbars extend in the first direction so as not to cross to each other.

5. The electric power converter of claim 3, wherein each of the first busbars and the second busbars is arranged in an order of NU, U, NV, V, NW, and W along the second direction.

6. The electric power converter of claim 3, wherein each of the first busbars and the second busbars is arranged in an order of U, NU, V, NV, W, and NW along the second direction.

7. The electric power converter of claim 3, wherein each of the first busbars and the second busbars is arranged in an order of NV, V, NW, W, NU, and U along the second direction.

8. The electric power converter of claim 1, further including:
   a current sensor coupled to an external side of the second power module portions and configured to measure a current of the first power module portions and the second power module portions by having the first busbars and the second busbars connected thereto.

9. The electric power converter of claim 8,
   wherein the current sensor includes AC output terminals connected to the motor, and
   wherein the AC output terminals are connected to the first busbars and the second busbars arranged in alternating order to each other thereon.

10. The electric power converter of claim 1, wherein the plurality of first busbars forms a busbar module integrally coupled to the body portion.

11. The electric power converter of claim 1, further including:
    a DC capacitor accommodated in the body portion.

12. The electric power converter of claim 1, wherein the second power module portions are connected to the motor and are operated all the time, and the first power module portions are temporarily operated to increase an output of the motor.

13. The electric power converter of claim 12, further including:
    a changeover switch module coupled to an external side of the first power module portions and connected to a controller to operate the first power module portions when disconnected.

14. The electric power converter of claim 13, further including:
    a third busbar connecting the changeover switch module and the first power module portions.

15. The electric power converter of claim 1, wherein each of the first power module portions includes a plurality of first power modules and a first bracket portion fastened to the plurality of first power modules and coupled to the body portion.

16. The electric power converter of claim 1, wherein each of the second power module portions includes a plurality of second power modules and a second bracket portion fastened to the plurality of second power modules and coupled to the body portion.

* * * * *